United States Patent [19]

Jain et al.

[11] Patent Number: 4,547,044

[45] Date of Patent: Oct. 15, 1985

[54] BEAM-FOLDING WEDGE TUNNEL

[75] Inventors: Kantilal Jain; Milton R. Latta, both of San Jose, Calif.

[73] Assignee: International Business Machines Corporation, Armonk, N.Y.

[21] Appl. No.: 481,011

[22] Filed: Mar. 31, 1983

[51] Int. Cl.[4] .............................................. G02B 3/06
[52] U.S. Cl. .................................... 350/433; 350/445
[58] Field of Search ....................... 350/433, 445, 96.1, 350/96.10, , 96.15

[56] References Cited

U.S. PATENT DOCUMENTS

| | | | |
|---|---|---|---|
| 2,604,005 | 7/1952 | Hahn | 350/445 |
| 3,660,778 | 5/1972 | Le Blanc | 331/94.5 |
| 4,042,821 | 8/1977 | Mierzwinski | 350/433 |

OTHER PUBLICATIONS

IBM Technical Disclosure Bulletin, vol. 24, No. 11A, Apr. 1982, pp. 5368-5370, "Optimized Wedge Illuminator for a Liquid-Filled Passive Display", J. C. Wood.
Applied Optics, vol. 10, No. 9, pp. 2179-2182 (1971) J. H. Myer, "Zoomable Kaleidoscopic Mirror Tunnel".

Primary Examiner—John K. Corbin
Assistant Examiner—P. M. Dzierzynski
Attorney, Agent, or Firm—Joseph E. Kieninger

[57] ABSTRACT

An apparatus forming a wedge shaped mirror tunnel makes the intensity distribution across a light beam uniform. A light beam is directed along a predetermined path through a cylindrical lens to focus the beam to a line at a particular point P. A plane mirror is placed along the predetermined path near point P so that the beam is folded onto itself. A plurality of cascaded optical means of this type, each stage of which comprises a focusing lens and a reflective surface, is used to achieve the beam uniformity needed for the chosen application. In each of the cascaded stages, the reflective surface is positioned at the appropriate angle to fold the beam upon itself.

6 Claims, 14 Drawing Figures

ONE REFLECTION

TWO REFLECTION

ONE REFLECTION

TWO REFLECTION

INPUT DISTRIBUTION

OUTPUT DISTRIBUTION

BEAM-FOLDING WEDGE TUNNEL

TECHNICAL FIELD

This invention relates to light beams and more particularly to an apparatus for making the intensity distribution across a light beam uniform.

BACKGROUND ART

In many applications in optics a uniform intensity distribution across a light beam is required. The light emitted by most lamp and laser sources does not have a flat intensity profile. As a result, some sort of optical system must be employed to uniformize a beam. One especially important class of light sources is excimer lasers, which have recently been shown to be very attractive for high resolution lithography, an application that typically requires the beam to have a uniform intensity distribution to better than within ±5%. U.S. Pat. No. 3,660,778 to LeBlanc, Sr. discloses a corner reflector laser beam folding device. A laser beam is reflected parallel to the incident beam and increasing the time duration the laser spends in the lasing medium, thereby producing a beam with increased power. IBM Technical Disclosure Bulletin Vol. 24 No. 11A, April 1982, page 5368 discloses a wedge-shaped acrylic light guide used to illuminate a liquid display. The wedge causes multiple internal reflections to concentrate the light on the display surface. Myer in Applied Optics, Vol. 10 No. 9, pages 2179-2182 (1971) describes the use of mirrors forming a cone for replicating images. It reports that a plane parallel mirror tunnel will replicate images in an orthogonal pattern whereas a cone mirror tunnel will replicate images in a virtual spherical pattern. None of the references describes the use of beam folding to increase beam uniformity and to sharpen edge definition.

SUMMARY OF THE INVENTION

It is a primary object of this invention to provide an apparatus for making the intensity distribution across a light beam uniform.

It is another object of this invention to provide an apparatus for sharpening the edge definition of a beam.

These and other objects are accomplished by using an apparatus which forms a wedge shaped mirror tunnel to make the intensity distribution across a light beam uniform. A light beam is directed along a predetermined path through a cylindrical lens to focus the beam to a line at a particular point P. A plane mirror is placed along the predetermined path near point P so that the beam is folded onto itself. A plurality of cascaded optical means of this type, each stage of which comprises a focusing lens and a reflective surface, is used to achieve the beam uniformity needed for the chosen application. In each of the cascaded stages, the reflective surface is positioned at the appropriate angle to fold the beam upon itself. A second embodiment includes two reflective surfaces at an angle chosen so that, for n reflections, the angle is $\theta/2^n$ where $\theta$ is the incident cone angle. Further embodiments include a rectangular cone, a circular cone and a solid material, for example, quartz, in which the reflections take place by total internal reflection.

DESCRIPTION OF PREFERRED EMBODIMENT

Figure 1A:
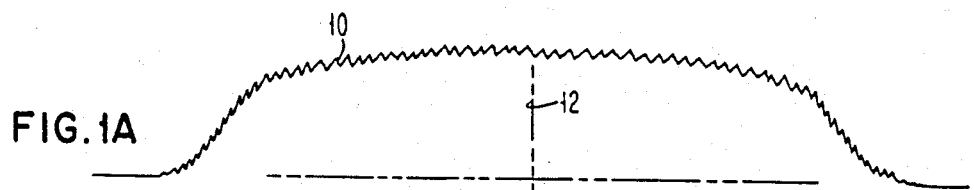
FIGS. 1A-1E illustrate an input beam profile and the uniformizing effect.

As shown in FIG. 1A, the beam from a laser source that is to be uniformized has a profile 10. The profile 10 is substantially the same on either side of the folding axis 12. In accordance with this invention, the beam is made uniform by folding it onto itself a few times. The folding process averages out the short-range noise-like fluctuations as well as the systematic long-range variations in a given profile.

Figure 1B:
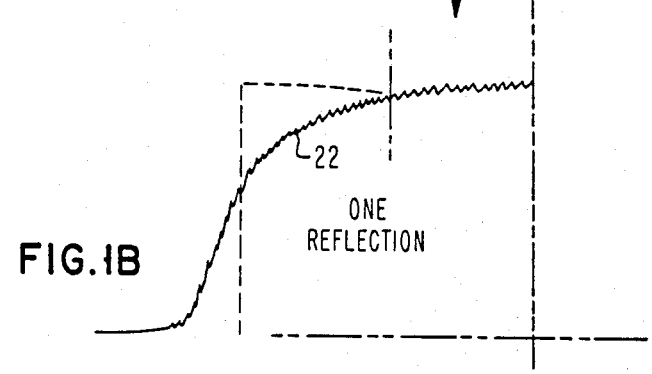
Figure 2A:
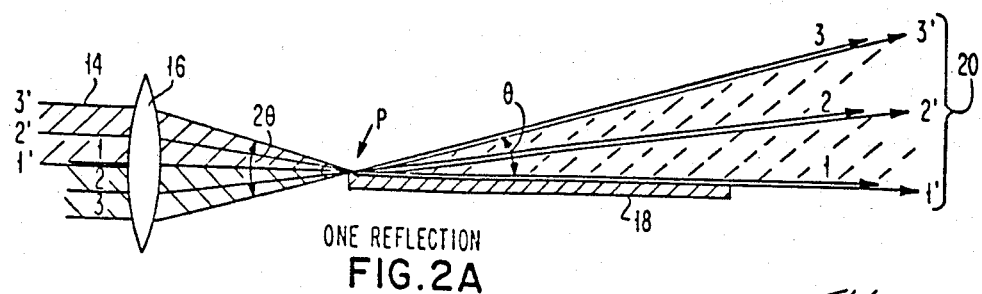
FIGS. 2A, 2B and 2C illustrate schematic views of embodiments in accordance with this invention having one, two and three mirrors respectively.

As shown in FIG. 2A, the beam 14 to be uniformized is focused with a cylindrical lens 16 into a line at P near the end of a plane mirror 18 placed near the axis of the beam. The cone (wedge) angle of the light incident at P is $2\theta$ in the plane of the paper. From the position of the mirror it can be seen that the lower half of the incident cone that is denoted by rays 1, 2 and 3 leaves the mirror without reflection. On the other hand, the other half of the incident cone, as denoted by rays 1', 2' and 3', undergoes one reflection and folds over to overlap with the unreflected half-cone to form beam 20. The profile 22 of the beam 20 after the mirror is shown in FIG. 1B. The divergence in the plane of the paper is $\theta$, that is, one-half of the incident cone (wedge) angle. While this folding operation reduces the fluctuation noise, it does not flatten the profile.

Figures 1C, 1D, 1E:
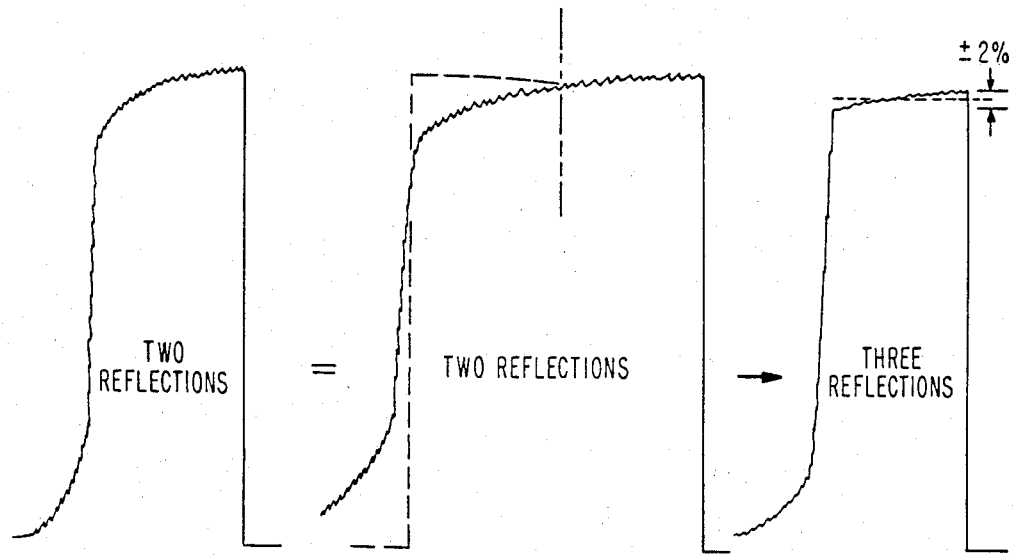
Figure 2B:
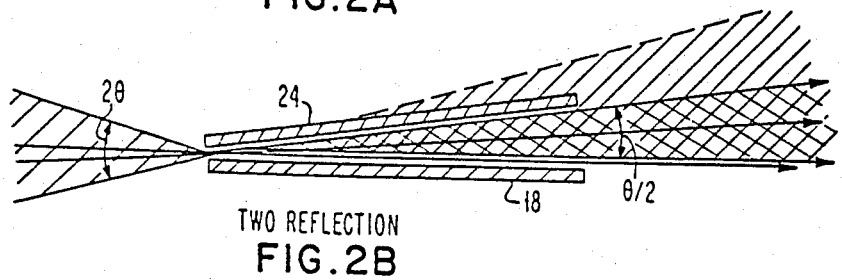

When a second mirror 24 is placed at an angle $\theta/2$ from the first mirror 18, as shown in FIG. 2B, the beam is folded over once more and its profile has a shape of the type shown in FIG. 1C or in an expanded form as shown in FIG. 1D.

Figure 2C:
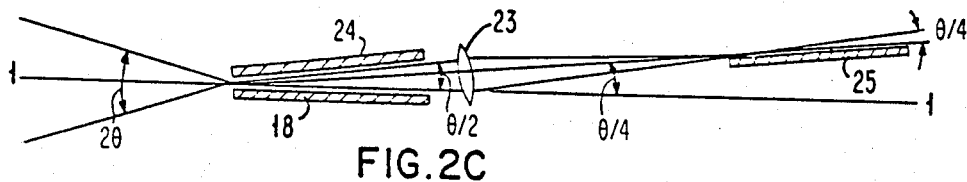

A third reflection provides the beam with a profile as shown in FIG. 1E which has a high degree of uniformity. The third reflection can be obtained in several ways. One way is to refocus by means of lens 23 the light obtained from mirrors 18 and 24 near the end of an additional mirror 25 inclined at $\theta/4$ with respect to line 1—1 as shown in FIG. 2C. Mirror 25 is parallel to the axes of the beam emerging from the lend 23. The third reflection may also be obtained more simply by making the angle between the first two mirrors 18 and 24 $\theta/4$ instead of $\theta/2$ as shown in FIG. 2B.

Figure 3:
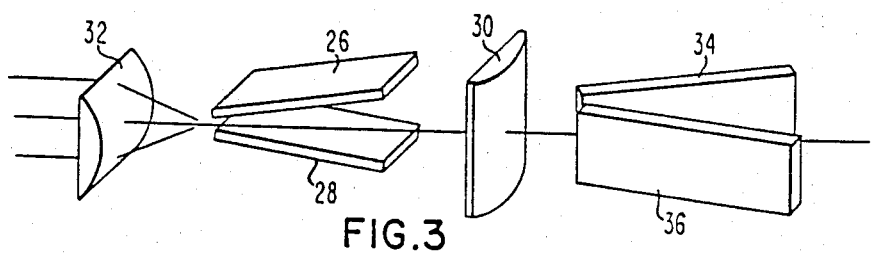
FIG. 3 is an alternate embodiment of this invention.

In general, if n reflections are wanted, the angle between the mirrors should be $\theta/2^n$, where $\theta$ the is incident cone angle. Neither of the mirrors has to be parallel to the axis of the incident wedge which allows the possibility of beam folding about some point other than the center of the input intensity distribution. In addition, since a finite entrance gap is required between the mirrors, the overlap will be slightly less than 100%. As a result, a little cropping will be required to pick out the uniform portion of the beam thereby making the throughput slightly less than 100%. According to an alternate embodiment as shown in FIG. 3, uniformity in the orthogonal direction is achieved by the use of two wedge tunnels. The first wedge tunnel consists of mirrors 26 and 28 which direct the beam to the cylindrical lens 30 that has its axis is at 90° to the axis of the first lens 32. The second tunnel consists of mirrors 34 and 36 which are at 90° to mirrors 26 and 28.

Figure 4:
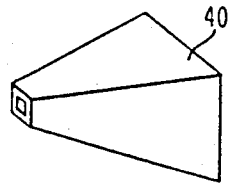
FIG. 4 depicts a rectangular cone with two sets of mirrors.
Figure 5:
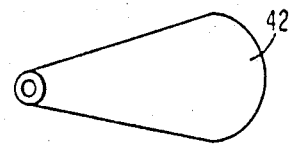
FIG. 5 illustrates a round conical mirror.

Alternatively, the two sets of mirrors may be combined into a pyramid 40 as shown in FIG. 4. Another configuration is shown in FIG. 5 that consists of a round conical mirror 42. The mirrors 40 and 42 would be positioned in the same position as mirrors 18 and 24 of FIG. 2. Cones may also be made of solid quartz with the reflections taking place by total internal reflection. In this case the appropriate cone angle will be reduced from the mirror case by a factor inversely proportioned to the index of refraction of quartz. In any of the configurations described above, the output light will be diverging after the final reflection. It is desirable to use an additional lens focused on the final reflection point, P, to render the output light collimated, and thus, more generally useful.

EXAMPLE

Figure 6:
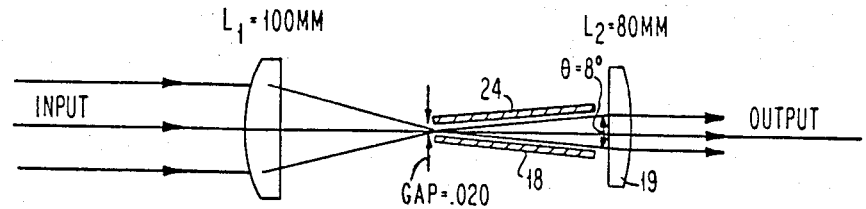
FIG. 6 illustrates a schematic view of an embodiment in accordance with this invention.
Figure 7A:
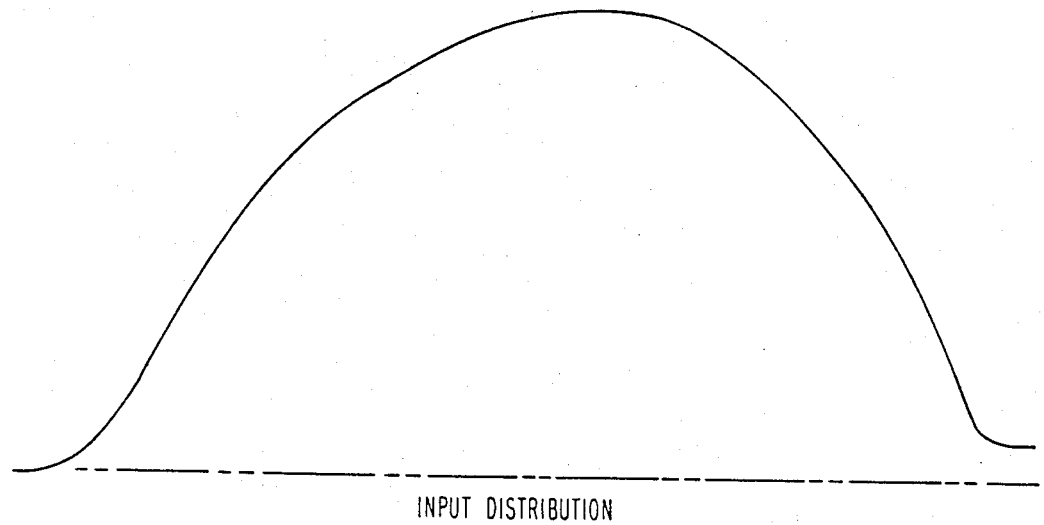
FIGS. 7A and 7B illustrate the input and output intensity distributions of the device in FIG. 6.
Figure 7B:
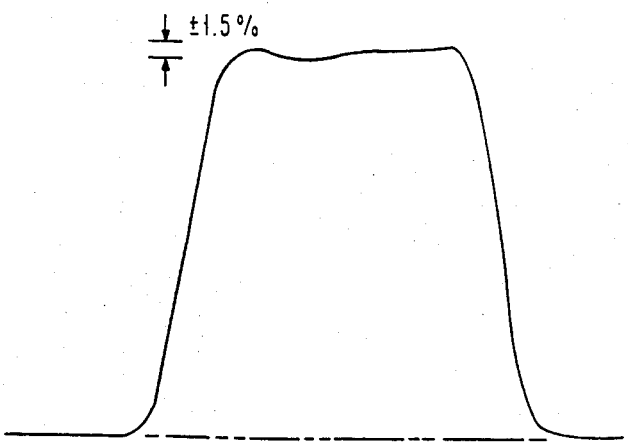

An experimental device was made as in FIG. 6. Input 16 and output 19 cylindrical lenses of 100 mm and 80 mm focal length, respectively were used to focus the light and subsequently re-collimate it. Two plane mirrors 18 and 24 inclined at an angle of 8° and separated by a gap of 0.020 inch were positioned about the focal point. In this case, two reflections are produced and the beam folding occurs at 2 mid-points of the intensity distribution. The input and output intensity distributions of the device in FIG. 6 are shown in FIGS. 7A and 7B respectively.

Although a preferred embodiment of this invention has been described, it is understood that numerous variations may be made in accordance with the principles of this invention.

What is claimed is:

1. An apparatus for making uniform the intensity distribution across a light beam that is directed along a predetermined path comprising
   first beam folding optical means including
   first optical means to focus said beam into a first line at a point along said predetermined path, and
   first reflecting optical means positioned along said path near said point to intercept part of the beam so as to permit a portion of the beam to be transmitted along said path and to cause another portion of the beam to be reflected back into the transmitted portion to make the intensity distribution across the light beam uniform.

2. An apparatus according to claim 1, wherein the optical reflecting means has the configuration substantially of a hollow cone with an internal reflecting surface.

3. An apparatus according to claim 1, wherein the optical reflecting means is a member of expanding dimension downpath of the focal point and of substantially hollow polygonal cross-section with internal reflecting surfaces.

4. An apparatus according to claim 1, including a plurality of first optical means and optical reflecting means arranged in cascading sets to provide sequentially reinforced transmitted beams of progressively narrower widths and a corresponding number of stages of reinforcement of their lower intensity edges.

5. An apparatus according to claim 4, wherein the successive sets of first optical means and optical reflecting means are arranged orthogonally relative to each other to maximize reinforcement in both orthogonal directions.

6. An apparatus for making uniform the intensity distribution across a light beam that is directed along a predetermined path comprising
   first beam folding optical means including
   first optical means to focus said beam into a first line at a point along said predetermined path,
   first reflecting optical means positioned along said path near said point, and
   second reflecting optical means positioned at an angle to and along said path near said point to form a wedge tunnel between said first and second reflecting optical means, said first and second reflecting optical means combining to intercept part of the beam so as to permit one portion of the beam to be transmitted along said path and cause another portion of the beam to be reflected back into the transmitted portion to make the intensity distribution across the light beam uniform.

* * * * *